(12) United States Patent
Chaoui

(10) Patent No.: US 6,812,686 B2
(45) Date of Patent: Nov. 2, 2004

(54) METHOD OF FORMING AN RF DETECTOR AND STRUCTURE THEREFOR

(75) Inventor: Hassan Chaoui, Toulouse (FR)

(73) Assignee: Semiconductor Components Industries, Phoenix, AZ (US)

( * ) Notice: Subject to any disclaimer, the term of this patent is extended or adjusted under 35 U.S.C. 154(b) by 0 days.

(21) Appl. No.: 10/369,471

(22) Filed: Feb. 21, 2003

(65) Prior Publication Data

US 2004/0166826 A1 Aug. 26, 2004

(51) Int. Cl.⁷ .............................................. G01R 23/04
(52) U.S. Cl. ....................... 324/95; 324/158.1; 327/78
(58) Field of Search .................. 324/95, 120, 768–769, 324/158.1; 327/52–53, 58, 60, 77–78, 538, 543; 323/315

(56) References Cited

U.S. PATENT DOCUMENTS

| | | | | | |
|---|---|---|---|---|---|
| 3,979,606 A | * | 9/1976 | Ahmed | ........................ | 327/78 |
| 4,749,880 A | * | 6/1988 | Kobatake | ..................... | 327/78 |
| 5,801,581 A | * | 9/1998 | Koizumi | ..................... | 327/538 |
| 6,404,241 B1 | | 6/2002 | Ackerman | | |

* cited by examiner

Primary Examiner—Minh N. Tang
(74) Attorney, Agent, or Firm—Robert F. Hightower

(57) ABSTRACT

An RF detector (15) is formed to compress the output voltage at two different rates depending on the value of the output voltage. Using two different rates of compression reduces saturation of the output voltage and reduces distortion. The RF detector (15) also provides temperature compensation in the output voltage to reduce output voltage variations due to temperature changes.

18 Claims, 3 Drawing Sheets

METHOD OF FORMING AN RF DETECTOR AND STRUCTURE THEREFOR

BACKGROUND OF THE INVENTION

The present invention relates, in general, to electronics, and more particularly, to methods of forming semiconductor devices and structure.

In the past, the electronics industry utilized various techniques to implement radio frequency (RF) detectors. An RF detector typically was utilized for extracting a low frequency (LF) signal that was used to modulate an RF carrier. One problem with previous RF detectors was the frequency response. Typically RF detectors were implemented in bipolar technology in order to obtain a good high frequency response. RF detectors implemented with MOS technology typically had a frequency response less than approximately 100 MHz. Because MOS technology results in lower product costs it would be desirable to have an MOS RF detector that operates at greater than 100 MHz.

Another problem with previous RF detectors was temperature stability. Typically, the output of previous RF detectors varied greater than plus or minus 5 decibels over a temperature range of −30 degrees to 80 degrees Celsius.

Additionally, previous RF detectors typically had distortion at the input due to impedance mismatches between the input stage and the antenna. Such mismatches resulted in harmonic distortion of the input signal. Another problem with previous RF detectors was output saturation. Typically, the input signal varied over a large range and caused the output stage of the RF detector to saturate when receiving the large input signal. Thus, such RF detectors had a small input dynamic range.

Accordingly, it is desirable to have a method of forming an RF detector that facilitates operation at high frequencies, that reduces input distortion, that has a large input dynamic range, and that has low temperature variation.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

Figure 1:
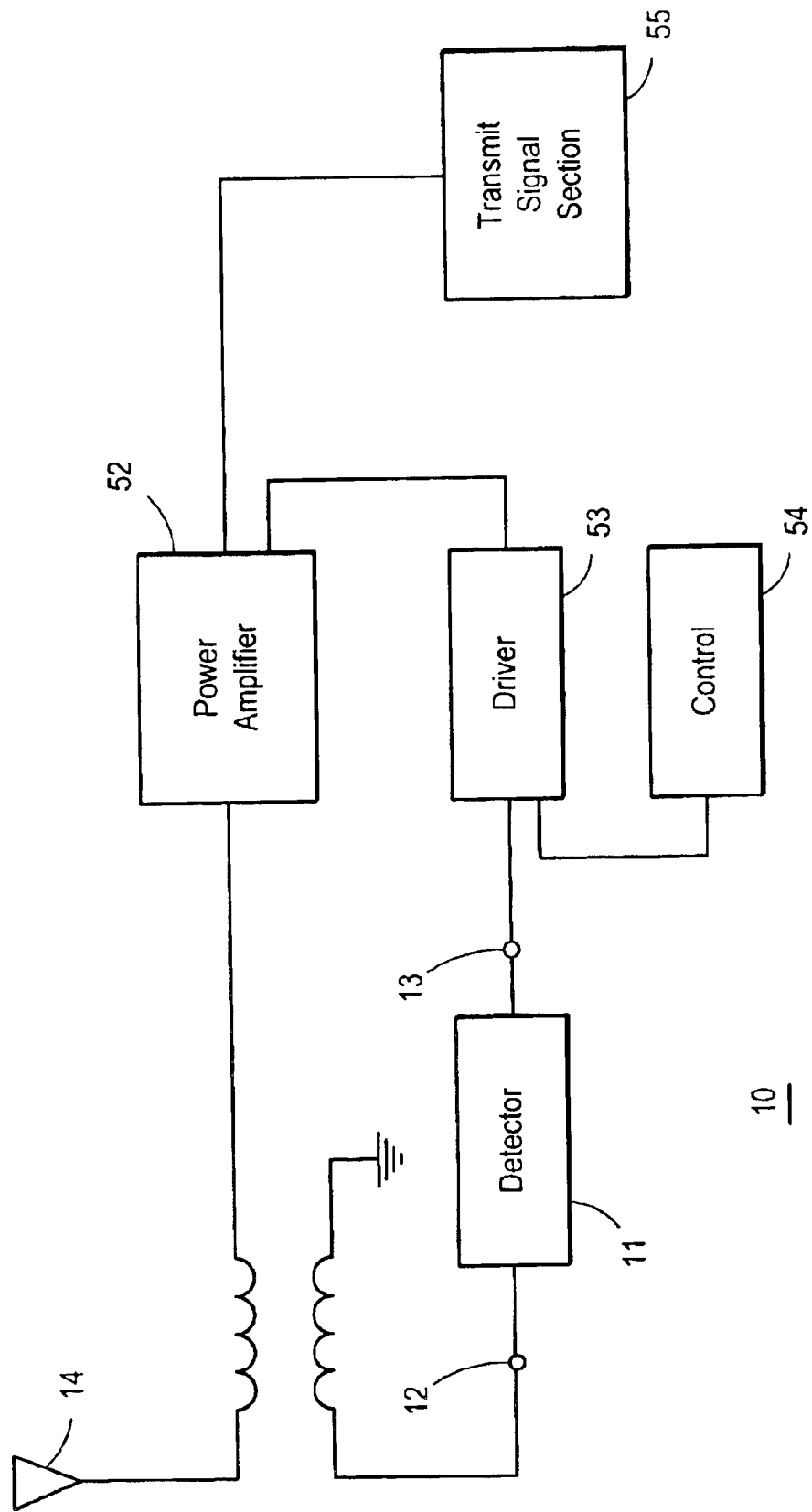
FIG. 1 schematically illustrates an embodiment of a portion of an RF transceiver in accordance with the present invention.

FIG. 1 schematically illustrates an embodiment of a portion of an RF System 10 that has an RF transmitter. RF system 10 includes a detector 11, a power amplifier 52, a control circuit 54, a driver circuit 53 for amplifier 52, and a transmit signal section 55. System 10 is coupled to an antenna 14 by a signal transformer. Antenna 14 is used to transmit and receive RF signals that typically are comprised of an RF carrier that is modulated by a low frequency or baseband signal containing information. Such RF Systems are used in various RF frequency applications including in cellular telephones and other similar applications. During transmissions a baseband information signal is generated in transmit signal section 55 of system 10. The baseband information signal is used to modulated an RF carrier and create a modulated RF transmit signal that is applied to an input of power amplifier 52. Amplifier 52 amplifies the modulated RF transmit signal and drives antenna 14 with the modulated RF transmit signal. A sample portion of the modulated RF transmit signal is coupled through the signal transformer and presented as a sampled signal to an input 12 of detector 11. The sampled signal is a modulated RF signal that is representative of the modulated RF transmit signal. Detector 11 rectifies the sampled signal, removes the RF carrier to leave a low frequency (LE) baseband signal, and provides a baseband output voltage or output voltage on a baseband output 13.

Figure 2:
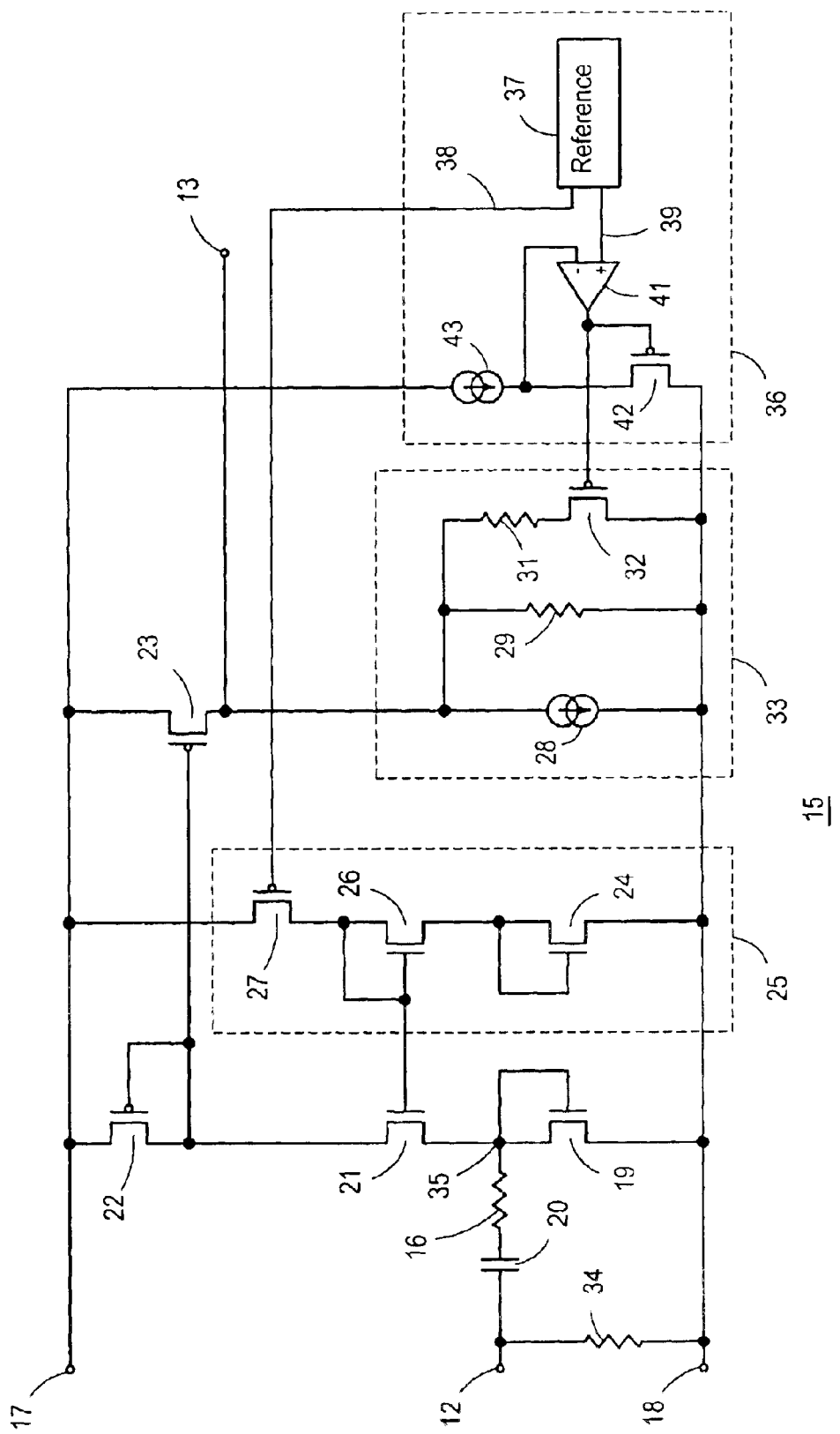
FIG. 2 schematically illustrates an embodiment of a portion of an RF detector in accordance with the present invention.

FIG. 2 schematically illustrates an embodiment of a portion of an RF detector 15 that is an embodiment of detector 11 explained in the description of FIG. 1. As will be seen hereinafter, detector 15 is formed to receive an input signal in the form of a modulated RF signal, convert the modulated RF signal to a modulated RF current that is representative of the input signal, rectify the modulated RF current, convert the modulated RF current to a first intermediate voltage, convert the first intermediate voltage to an intermediate current that is representative of the baseband signal portion of the modulated RF current, and convert the intermediate current to the output voltage. As will be seen in the detailed description that follows, in the preferred embodiment detector 15 is formed to convert the modulated RF signal into an intermediate voltage that is representative of the baseband signal portion of the modulated RF signal and to utilize the intermediate voltage to form the output voltage that varies with the baseband signal portion of the received modulated RF input signal. Detector 15 also compresses the output voltage to ensure that the dynamic range of the output voltage does not cause saturation or distortion of the output stage or of the output voltage.

Detector 15 is formed to include an input section that includes a matching resistor 34, a series coupling capacitor 20, and an input resistor 16. The input section receives the voltage of the sampled signal on an input 12 and couples an input signal to an input node 35 and to an input transistor 19. The voltage of the sampled signal is received at input 12 of detector 15. A matching resistor 34 matches the input impedance of detector 15 with the output impedance of amplifier 52 shown in FIG. 1. Resistor 34 is coupled in series between input 12 and a power return 18 of detector 15 in order to provide the matching. Those skilled in the art understand that when detector 15 is formed on a semiconductor die, that resistor 34 may be external to detector 15 in order facilitate making a more exact match to the output impedance and to reduce power dissipation on the semiconductor die. A series coupling capacitor 20 is coupled in series between input 12 and transistor 19 in order to block DC voltages and to isolate the input of detector 15 from amplifier 52. In the preferred embodiment, capacitor 20 is formed to have a value of approximately six pico-farads (6 pf) in order to provide the desired blocking characteristics. An input resistor 16 is coupled in series between capacitor 20 and transistor 19 in order to reduce the input harmonic distortion that would result if capacitor 20 were directly connected to transistor 19. It has been found that forming detector 15 to include resistor 16 reduces the input harmonic distortion by approximately minus twenty dB (−20 dB) over prior detectors. The voltage of the sampled signal is applied to input 12 and forms two currents. One current flows through resistor 34 and another flows through resistor 16 and forms the input signal at node 35 of detector 15. The current of the input signal is a modulated RF current that represents the voltage of the modulated RF sampled signal from the transformer shown in FIG. 1.

Detector 15 is formed to receive power between a power input 17 and power return 18. Detector 15 is formed to include diode coupled rectifier transistor 19 coupled to receive the input signal. A pass transistor or first transistor 21 is also coupled to receive the input signal and to pass the input signal to a second transistor or conversion transistor 22. Transistor 22 is part of a current mirror formed by transistor 22 and a third transistor 23. A bias network 25 of detector 15 is formed to couple a direct current (DC) bias current to transistor 21. In the preferred embodiment, network 25 includes a current source transistor 27, a bias transistor 26 formed in a current mirror configuration with transistor 21, and a matching transistor 24. A voltage compression circuit 33 is formed to compress the output voltage so that the output voltage changes at a first rate of change when the output voltage is less than a first output voltage value and changes at a second rate of change when the output voltage is equal to or greater than the first output voltage value. In the preferred embodiment, circuit 33 includes a compression switch transistor 32 that is utilized to switch between the first rate and the second rate, a common mode current source 28, a first output resistor 29, and a second output resistor 31. A compensation circuit 36 is formed to minimize temperature variations of the output voltage. Compensation circuit 36 preferably includes a reference voltage circuit or reference 37, a compensation operational amplifier or op-amp 41, a compensation transistor 42, and a compensation current source 43. In the preferred embodiment, transistors 19, 21, 24, and 26 are formed as N-channel metal oxide semiconductor (MOS) transistors, transistors 22, 23, 27, 32, and 42 are formed as P-channel MOS transistors, op-amp 41 is formed as a complementary MOS (CMOS) op-amp, reference 37 is formed as a CMOS band-gap reference generator, and current sources 28 and 43 are formed as CMOS transistors that receive a bias voltage (not shown) from reference 37.

In the DC operational mode, current source transistor 27 is coupled to receive a bias reference voltage from a first output 38 of reference 37. Transistor 27 is formed to receive the bias reference voltage and responsively generate a bias current that flows through transistors 26 and 24. Because of the current mirror configuration of transistors 21 and 26, transistor 26 generates a voltage that biases transistor 21 to produce the same current through transistor 21. In the preferred embodiment, transistor 26 is formed to match the size, length, width, and orientation of transistor 21 so that both have the same gate-to-source voltages and through currents, and transistor 24 is formed to match transistor 19 to ensure that the current flowing through transistors 24 and 26 will properly bias transistor 21. In this preferred embodiment, transistor 27 is formed to produce a bias current of approximately ten (10) micro-amps. In addition to bias network 25, current source 28 is formed to generate an intermediate DC bias current that flows through transistor 23. Due to the current mirror connection of transistors 22 and 23, the DC current flowing through transistor 23 is the current flowing through transistor 22 multiplied by the matching ratio between the two transistors. The difference between the current flowing through transistor 23 and the current provided by current source 28 has to flow through resistor 29. This DC bias current difference through resistor 29 sets the common mode output voltage at output 13. In the preferred embodiment, transistor 22 is three times smaller than the size of transistor 23. Since ten (10) micro-amps flows through transistor 22, thirty micro-amps flows through transistor 23. Also in this preferred embodiment, current source 28 is formed to generate a DC current of twenty-six (26) micro-amps. The difference of four (4) micro-amps flows through resistor 29 resulting in a common mode output voltage of two hundred milli-volts (200 mv) at output 13.

In AC operation, the sampled signal in the form of the modulated RF voltage is received by detector 15 at input 12 and the corresponding input signal in the form of the modulated RF current is received at node 35. The input signal includes two components a first signal that has a first frequency that is always less than a first frequency value, for example a baseband signal, and a second signal that has a second frequency that is greater than, preferably at least ten times greater than, the first frequency, for example an RF carrier. The sampled signal is coupled through capacitor 20 and resistor 16 to node 35 and coupled to transistors 19 and 21 as the modulated RF current. In the preferred embodiment, the modulated RF current is coupled to the drain of transistor 19 and to the source of transistor 21. For each cycle of the input signal, the positive going current of the cycle enables transistor 19 to couple this portion of the input signal to return 18. Because of the biasing applied to transistor 21, the negative going portion of the cycle enables transistor 21 to pass this portion of the input signal through transistor 21 and transistor 22 to input 17. As this negative current flows through transistor 22, it increases the control voltage of transistor 22 thereby converting the current to an intermediate voltage. In the preferred embodiment, the current increases the gate-to-source voltage of transistor 22 and converts the current to a voltage by a first square root law or rule. Since transistor 22 and 23 are connected in a current mirror configuration, the increased gate-to-source voltage of transistor 22 results in an increase in the current passing through transistor 23. Thus, the voltage is converted to a second current or intermediate current. In the preferred embodiment, the voltage is converted to a current by a second square law or rule. Transistors 22 and 23 are formed to have a cut-off frequency low enough so that transistors 22 and 23 do not respond to the high frequency RF carrier signal but only respond to the baseband signal that is used to modulate the RF carrier. Typically, transistor 21 has a cut-off frequency that is greater than the cut-off frequency of transistors 22 and 23 to ensure that the input signal is coupled to transistor 22. Consequently, the current passing through transistor 22 increases the control voltage at a frequency less than the second frequency so that the changes in the control voltage is devoid of the second signal, thus, the RF carrier is removed and the changes in the control voltage are representative of the baseband portion of the modulated RF signal. Those skilled in the art will recognize that only one of transistors 22 and 23, instead of both of transistor 22 and 23, may be formed to have the low frequency response and still achieve the desired removal of the RF carrier. In the preferred embodiment, the width of transistor 23 is larger than the width of transistor 22 so that the changing current through transistor 23 is greater than the current through transistor 22 by the value of this ratio. The change in the current through transistor 23 is conducted through resistor 29 and results in a change in the output voltage at output 13, thus, converting the current to a voltage by a linear relationship or rule. As the value of the current through transistor 23 continues to increase with increases in the input signal, the value of the changes in the output voltage continues to increase until the output voltage reaches a value that is equal to the value of a compression voltage applied to the control electrode of transistor 32. At this compression voltage value, transistor 32 is enabled and a portion of the current through transistor 23 begins to be conducted through resistor 31 in addition to transistor 32. Resistor 31 is now coupled in parallel with resistor 29, consequently, the value of the output voltage now changes at a different rate for a given change in the value of the current through transistor 23. The value of resistor 31 is formed to be much larger than the resistance of transistor 32 when transistor 32 is enabled, preferably about ten (10) times larger. Such a value minimizes any temperature variations in transistor 32 from effecting the output voltage value. When the current through transistor 23 reduces to a value that lowers the output voltage below the compression voltage value, transistor 32 is disabled and the output voltage once again changes at the first rate. Thus, the output voltage changes at a first-rate when the value of the output voltage is less than a first output voltage value or the compression voltage value and changes at a second rate when the output voltage is equal to or greater than, i.e. not loss than, this first output voltage value. In the preferred embodiment, the compression voltage is formed to be approximately 1.2 volts. In this preferred embodiment the output voltage varies from the common mode voltage by an amount ranging from about ten milli-volts (10 mV) to a maximum of 1.4 Volts for a corresponding variation of the input voltage at input 12 of thirteen milli-volts peak-to-peak (13 mV) to six volts peak-to-peak (6.0 V). Without the compression, the maximum output voltage would be greater than six volt (6.0 V) and would saturate the output causing a distorted output voltage.

The transfer function or equation for detector 15 illustrating switching the rate of change of the output voltage as a function of the output voltage can be represented as:

$$VO=((3(VIN \times R29))/RIN)+CMV \text{ when } VO<VCMP$$

$$VO=(((3VIN/RIN)-((VCMP-CMV)/R29)) \times R31)+VCMP \text{ when } VO \geq VCMP$$

Where:

VO=the output voltage,

VIN=the peak-to-peak voltage at input 12,

CMV=the common mode voltage,

VCMP the value of the compression voltage applied to transistor 32 (1.2 volts in the preferred embodiment), R29=the value of resistor 29, R31=the value of resistor 31, and RIN=the value of the equivalent resistance of transistors 21 and 22 in series from the source of transistor 21 to input 17.

Compensation circuit 36 assists in minimizing temperature variations in the output voltage. Reference 37 is formed to provide a compression reference value on an output 39. Op-amp 41 is formed to receive the compression reference value on a positive input of op-amp 41. The output of op-amp 41 is coupled to a control electrode of transistors 32 and 42. Transistor 42 is formed to match transistor 32 so that any temperature variations in transistor 32 are matched by corresponding variations in transistor 42. The drain of transistor 42 is coupled to an inverting input of op-amp 41. Consequently, any changes in the drain voltage of transistor 42 with temperature cause a corresponding opposite change (through op-amp 41) in the compression voltage that is applied to transistors 32 and 42. This change in the compression voltage forces the drain voltage of transistor 32 to be maintained at a substantially constant value as the temperature varies. In the preferred embodiment, the feedback configuration of op-amp 41 provides a unity gain, thus, the compression voltage value applied to the gate of transistors 32 and 42 is the same as the compression reference value on output 39. In this preferred embodiment, circuit 36 facilitates forming detector 15 to have an output voltage variation no greater than plus or minus one-half dB (±0.5 dB) over a temperature range of minus thirty degrees Celsius to plus eighty degrees Celsius (−30° C. to 80° C.).

In other embodiments, transistor 42 may be an N-channel MOS transistor having a gate connected to the output of op-amp 41. In this other embodiment, the positive and negative inputs of op-amp 41 are reversed.

In order to provide this operation, diode coupled transistor 19 has a source coupled to receive the input signal on node 35, a gate coupled to the first current carrying electrode, and a second current carrying electrode coupled to return 18. Transistor 21 has a source coupled to the drain of transistor 19, a gate connected to a gate of transistor 26, and a drain connected to a drain and a gate of transistor 22. Transistor 22 also has a source connected to input 17. Transistor 23 has a gate connected to the gate of transistor 22, a source connected to input 17, and a drain connected to output 13. Transistor 27 has a source connected to input 17, a drain connected to both a drain and a gate of transistor 26, and a gate connected to output 38 of reference 37. Transistor 26 has a source connected to a drain and a gate of transistor 24, and transistor 24 has a source connected to return 18. Current source 28 has a first terminal connected to output 13 and a second terminal connected to return 18. Resistor 29 has a first terminal connected to return 18 and a second terminal connected to output 13 and to a first terminal of resistor 31. A second terminal of resistor 31 is connected to a source of transistor 32. Transistor 32 has a drain connected to return 18 and a gate connected to the output of op-amp 41. Current source 43 has a first terminal connected to input 17 and a second terminal connected to both the inverting input of op-amp 41 and to a drain of transistor 42. A gate of transistor 42 is connected to the output of op-amp 41 and a drain of transistor 42 is connected to return 18. The non-inverting input of op-amp 41 is connected to output 39 of reference 37.

Figure 3:
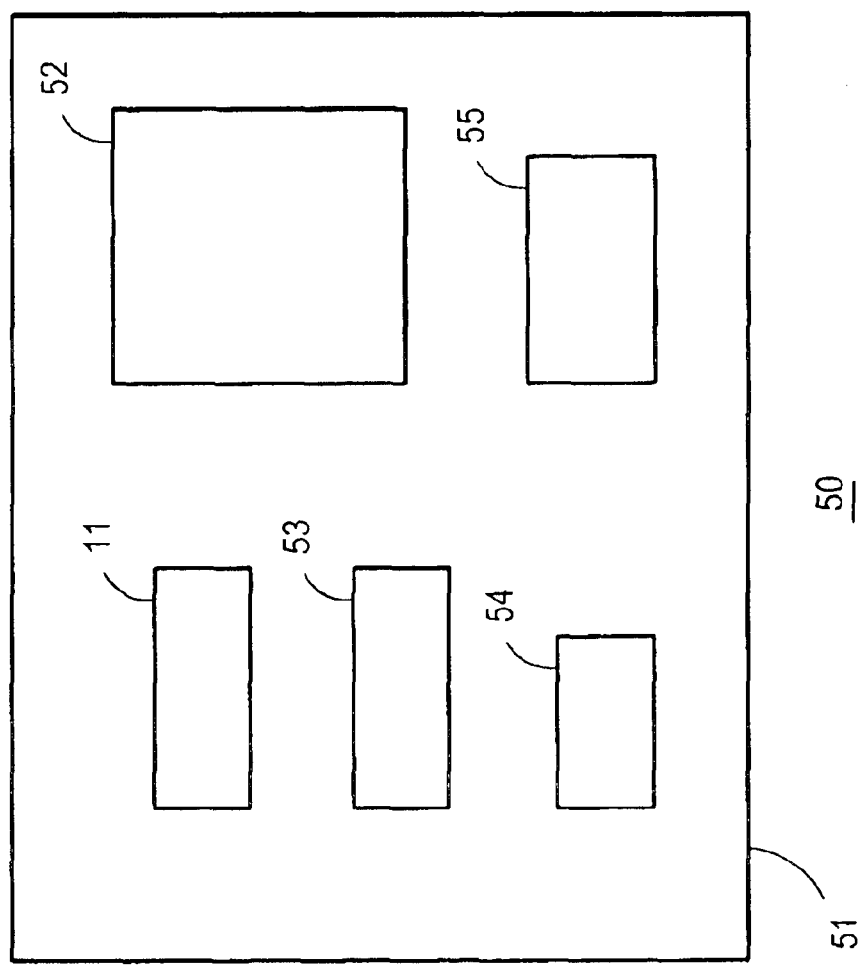
FIG. 3 schematically illustrates an enlarged plan view of a semiconductor device in accordance with the present invention.

FIG. 3 schematically illustrates an enlarged plan view of a semiconductor device 50 formed on a semiconductor die 51. Device 50 is an embodiment of system 10 and detector 15, described in the descriptions of FIG. 1 and FIG. 2, formed on die 51.

In view of all of the above, it is evident that a novel device and method is disclosed. Forming matching resistor 16 in series in the input reduces input signal distortion. Converting the input current to the intermediate voltage utilizing transistors with a lower cut-off frequency facilitates demodulating the baseband signal from the RF carrier. Converting the intermediate voltage to an intermediate current facilitates switching the transfer function and compressing the output voltage to prevent output voltage saturation and distortion.

While the invention is described with specific preferred embodiments, it is evident that many alternatives and variations will be apparent to those skilled in the semiconductor arts. More specifically the invention has been described for a particular N-channel and P-channel transistors, although the method is directly applicable to other MOS transistors, such as BiCMOS, metal semiconductor FETs (MESFETs), HFETs, and other transistor structures.

What is claimed is:

1. A method of forming an RF detector comprising:

forming a first transistor to receive an RF input signal and generate a first current that is representative of the RF input signal;

forming a second transistor coupled to receive the first current and responsively form an intermediate voltage representative of the first current; and forming a third transistor coupled to receive the intermediate voltage, form a second current that is proportional to the first current, and form an output voltage that varies with the RF input signal wherein the output voltage varies at a first rate when the output voltage is less than a first output voltage value and the output voltage varies at a second rate when the output voltage is not less than the first output voltage value including coupling a voltage compression circuit to receive the second current and responsively form the output voltage.

2. The method of claim 1 wherein coupling the voltage compression circuit to receive the second current and responsively form the output voltage includes coupling a compression switch transistor to steer the second current through a first output resistor when the output voltage is less than the first output voltage value and steer the second current through a second output resistor when the output voltage is not less than the first output voltage value.

3. The method of claim 2 wherein coupling the compression switch transistor to steer the second current includes coupling a compensation transistor to receive a reference voltage from an output of an operational amplifier, coupling an input of the operational amplifier to the compensation transistor, and coupling the compression switch transistor to also receive the reference voltage from the output of the operational amplifier.

4. The method of claim 2 further including forming an input transistor to receive the RF input signal and couple the RF input signal to a voltage return.

5. The method of claim 1 further including forming a current source transistor coupled to provide a reference current to a bias transistor, and coupling the bias transistor to the first transistor.

6. The method of claim 5 wherein coupling the bias transistor to the first transistor includes coupling the bias transistor to the first transistor in a current mirror configuration.

7. The method of claim 1 wherein forming the second transistor coupled to receive the first current and responsively form the intermediate voltage includes forming the intermediate voltage from the first current using & square root law and wherein forming the third transistor coupled to receive the intermediate voltage and form the output voltage includes forming an intermediate current from the intermediate voltage by using a square law.

8. A method of forming an RF detector comprising:

forming a first transistor to receive an RE input signal and generate a first current that is representative of the RF input signal including forming the first transistor to receive the RF input signal having a first signal that has a frequency that is always less than a first frequency and a second signal that has a frequency that is always not less than the first frequency;

forming a second transistor coupled to receive the first current and responsively form an intermediate voltage representative of the first current; and forming a third transistor coupled to receive the intermediate voltage and form an output voltage that varies with the RF input signal wherein the output voltage varies at a first rate when the output voltage is less than a first output voltage value and the output voltage varies at a second rate when the output voltage is not less than the first output voltage value.

9. The method of claim 8 wherein forming the second transistor and forming the third transistor includes forming the second transistor and forming the third transistor to have a cut-off frequency that is less than the first frequency.

10. A method of detecting an RF signal comprising:

receiving an RF input signal having a first signal component and a second signal component wherein the first signal component is less than a first frequency and the second signal component is not less than the first frequency;

converting the RF input signal to a first voltage that varies at a frequency less than the first frequency wherein the first voltage is devoid of the second signal component;

converting the first voltage to a first current that is proportional to the first voltage; and converting the first current to an output voltage at a first rate when the output voltage is less than a first output voltage value and at a second rate when the output voltage is not less than the first output voltage value.

11. The method of claim 10 wherein converting the first current to the output voltage includes forming the output voltage to have a temperature variation no greater than plus or minus 0.5 dB over a temperature range of minus 35 to plus 85 degrees Celsius.

12. The method of claim 11 wherein converting the first current to the output voltage at the first rate when the output voltage is less than the first output voltage value and at the second rate when the output voltage is not less than the first output voltage value includes steering the first current through a first conversion circuit when the output voltage is less than the first output voltage value and steering the first current through a second conversion circuit when the output voltage is not less than the first output voltage value.

13. The method of claim 12 wherein steering the first current through the first conversion circuit when the output voltage is less than the first output voltage value arid steering the first current through the second conversion circuit when the output voltage is not less than the first output voltage value includes steering the first current through the first conversion circuit and the second conversion circuit when the output voltage is not less than the first output voltage value.

14. The method of claim 11 wherein forming the output voltage to have the temperature variation includes applying a bias voltage to an input of an operational amplifier, using an output of the operational amplifier to bias a compensation transistor and to bias a switch transistor, and coupling the compensation transistor to another input of the operational amplifier.

15. The method of claim 10 wherein converting the RF input signal to the first voltage that varies at the frequency less than the first frequency wherein the first voltage is devoid of the second signal component includes converting the first signal to the first voltage using a transistor having a frequency response that is less than the first frequency.

16. The method of claim 10 wherein converting the RF input signal to the first voltage that varies at the frequency less than the first frequency wherein the first voltage is devoid of the second signal component includes converting the RF input signal to a second current that has the first signal component and the second signal component.

17. A RF detector comprising:

an output;

a first transistor having a first current carrying electrode coupled to an input of the RF detector, a control electrode coupled to receive a bias voltage from a bias network, and a second current carrying electrode;

a second transistor having a first current carrying electrode coupled to the second current carrying electrode of the first transistor, a control electrode coupled to the first current carrying electrode of the second transistor, and a second current carrying electrode coupled to a power input, the second transistor having a cut-off frequency that is less than a first value;

a voltage compression circuit coupled to have a first impedance when a value of an output voltage is less than a first output voltage value and to switch the first impedance to a second impedance when the value of the output voltage is not less than the first output voltage value;

a third transistor having a control electrode coupled to the control electrode of the second transistor, a first current carrying electrode coupled to a power input, and a second current carrying electrode coupled to the output of the RF detector and coupled to receive a bias current from the voltage compression circuit; and a temperature compensation circuit coupled to provide the voltage compression circuit a first bias voltage value that varies less than 0.50 dB over a temperature range of minus 35 degrees Celsius to 85 degrees Celsius.

18. The RF detector of claim 17 wherein the voltage compression circuit coupled to have the first impedance when the value of the output voltage is less than the first output voltage value includes a first resistor having a first terminal coupled to a power return and a second terminal coupled to the output of the RF detector, a second resistor having a first terminal coupled to the second terminal of the first resistor and a second terminal, a switch transistor having a first current carrying electrode coupled to the second terminal of the second resistor, a second current carrying electrode coupled to the power return, and a control electrode coupled to receive the first bias voltage value.

* * * * *